United States Patent
English et al.

(10) Patent No.: US 10,742,202 B1
(45) Date of Patent: Aug. 11, 2020

(54) AUTOZERO TO AN OFFSET VALUE FOR A SLOPE DETECTOR FOR VOLTAGE DROOP MONITORING

(71) Applicant: International Business Machines Corporation, Armonk, NY (US)

(72) Inventors: Erik English, Poughkeepsie, NY (US); Michael Sperling, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/519,105

(22) Filed: Jul. 23, 2019

(51) Int. Cl.
| H03K 5/003 | (2006.01) |
| H03K 5/24 | (2006.01) |
| G01R 19/165 | (2006.01) |
| H03K 5/1252 | (2006.01) |
| H04B 10/69 | (2013.01) |

(52) U.S. Cl.
CPC ....... *H03K 5/003* (2013.01); *G01R 19/16504* (2013.01); *G01R 19/16576* (2013.01); *H03K 5/1252* (2013.01); *H03K 5/24* (2013.01); *H04B 10/6933* (2013.01); *H03F 2203/45212* (2013.01)

(58) Field of Classification Search
CPC ........ H03K 5/003; H03K 5/24; H03K 5/1252; G01R 19/16576; G01R 19/16504; H03F 2203/45212; H04B 10/6933
See application file for complete search history.

(56) References Cited

U.S. PATENT DOCUMENTS

| 4,906,864 A | 3/1990 | McCorkle |
| 5,332,931 A * | 7/1994 | Crispie .............. G01R 19/0038 327/55 |
| 7,528,619 B2 | 5/2009 | Paillet et al. |

(Continued)

FOREIGN PATENT DOCUMENTS

| WO | 2015119971 A1 | 8/2015 |
| WO | 2016160559 A1 | 10/2016 |
| WO | 2018160578 A1 | 9/2018 |

OTHER PUBLICATIONS

D. Kamakshi, "Modeling and Design for Low Power and Variation Tolerance in Integrated Circuits," Dec. 2017. 123 Pages.

(Continued)

*Primary Examiner* — Jung Kim
(74) *Attorney, Agent, or Firm* — Cantor Colburn LLP; William Kinnaman

(57) ABSTRACT

Techniques for autozero to an offset value for a slope detector for voltage droop monitoring are described herein. An aspect includes generating a first offset voltage by a circuit. Another aspect includes generating a second offset voltage by the circuit, the second offset voltage being distinct from the first offset voltage. Another aspect includes, based on a first comparator of the circuit entering an autozero mode, connecting a first terminal of the first comparator to the first offset voltage. Another aspect includes connecting a second terminal of the first comparator to the second offset voltage. Yet another aspect includes performing an autozero operation in the first comparator, wherein a trip point of the first comparator is set to a difference between the first offset voltage and the second offset voltage by the autozero operation.

20 Claims, 3 Drawing Sheets

(56) References Cited

U.S. PATENT DOCUMENTS

| | | |
|---|---|---|
| 7,710,084 B1 | 5/2010 | Guo |
| 8,060,766 B2 | 11/2011 | Konstadinidis et al. |
| 9,841,776 B1 | 12/2017 | Bari et al. |
| 10,054,617 B2 | 8/2018 | Li et al. |
| 10,145,868 B2 | 12/2018 | Chong et al. |
| 10,162,373 B1 | 12/2018 | Chong et al. |
| 2007/0290657 A1 | 12/2007 | Cretella et al. |
| 2018/0284828 A1 | 10/2018 | Mosalikanti et al. |
| 2019/0044442 A1 | 2/2019 | Schaef |

OTHER PUBLICATIONS

English et al., "Slope Detector for Voltage Droop Monitoring," U.S. Appl. No. 16/519,108, filed Jul. 23, 2019.
IBM "List of IBM Patents or Patent Applications Treated As Related; (Appendix P)", Filed Jul. 23, 2019, 2 pages.
Quinn et al., "Droop Compensation Versus Ideal Regulation", Power Electronics Technology, Nov. 2004. 2 Pages.

\* cited by examiner

AUTOZERO TO AN OFFSET VALUE FOR A SLOPE DETECTOR FOR VOLTAGE DROOP MONITORING

BACKGROUND

The present invention generally relates to integrated circuits, and more specifically, to autozero to an offset value for a slope detector for voltage droop monitoring in integrated circuits.

In high performance processors or other integrated circuits, to increase the processing performance of the processor, the processor chip design may include one or more of one or more processor cores and one or more pipelines connecting the processor cores. In addition, in a high performance system, processor system designs often include multiple chips sharing a common supply rail of a power distribution network providing a supply voltage. As the number of processor cores on a same chip or across multiple chips, all sharing a common supply rail, increases, the number of circuits that switch per clock cycle also increases.

In a processor there is noise generated by circuit switching activity at each clock cycle by nodes, busses, and other circuit components sharing a common supply rail. One result of noise generated by circuit switching activity, also referred to as power grid noise or di/dt noise, is that a sudden increase in noise may induce a droop in the supply voltage to the common supply rail of the power distribution network. A sudden, large droop in the supply voltage slows down the circuit response and therefore may cause timing errors on the logical circuit.

SUMMARY

Embodiments of the present invention are directed to autozero to an offset value for a slope detector for voltage droop monitoring. A non-limiting example computer-implemented method includes generating a first offset voltage by a circuit. The method also includes generating a second offset voltage by the circuit, the second offset voltage being distinct from the first offset voltage. The method also includes, based on a first comparator of the circuit entering an autozero mode, connecting a first terminal of the first comparator to the first offset voltage. The method also includes connecting a second terminal of the first comparator to the second offset voltage. The method also includes performing an autozero operation in the first comparator, wherein a trip point of the first comparator is set to a difference between the first offset voltage and the second offset voltage by the autozero operation.

Other embodiments of the present invention implement features of the above-described method in systems and apparatuses.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

One or more embodiments of the present invention provide autozero to an offset value for a slope detector for voltage droop monitoring. A voltage droop monitor may compare a regulated supply voltage to a reference value in order to detect when the regulated supply voltage droops below a threshold. Knowledge of a droop event may trigger a supply regulation circuit that increases the regulated supply voltage to compensate for the droop, or may lower the processor frequency to mitigate timing violations that may occur at lower supply voltage. If a voltage droop monitor signals after a voltage droop has occurred, the regulated supply voltage may be maintained at a relatively high level above the minimum required by the processor, so as to maintain the regulated supply voltage at an appropriate level under droop conditions. This increased supply voltage may increase processor power consumption.

Embodiments of autozero to an offset value for a slope detector for voltage droop monitoring may include low pass filtering an input voltage (e.g., a rail voltage of an integrated circuit) that is being monitored for voltage droop. The input voltage and the filtered voltage are compared to detect the occurrence of a voltage droop in the input voltage having a magnitude and time scale above a slope threshold. For a decrease in the input voltage that has a relatively small slope, the filtered voltage may track the input voltage, and no voltage droop condition may be detected. For a decrease in the input voltage that has a relatively large slope, the filtered voltage may change comparatively slowly, such that the difference between the input voltage and the filtered voltage may be relatively large, and an imminent voltage droop condition in the input voltage may be detected. Slope-based voltage droop monitoring may enable detection of an imminent voltage droop just as the droop is starting, allowing compensatory measures to be taken in a predictive rather than reactive manner.

Embodiments of autozero to an offset value for a slope detector for voltage droop monitoring may further include modification of an autozero mode of a comparator circuit to include an offset value that is introduced into the comparator corresponding to a difference between two offset voltages. By autozeroing the comparator to the offset value, an amount of slope of a decrease in the input voltage that corresponds to an imminent voltage droop condition may be set in the voltage droop detection circuit. Reference circuitry may be independent of the signal level, so that relative offset applications such as slope detection may be implemented using the comparator that is autozeroed to an offset. Some embodiments of circuits including autozero to an offset value may be entirely analog circuits, reducing the need for any digital control circuitry. No current loading of the input voltage may be necessary in some embodiments.

Figure 1:
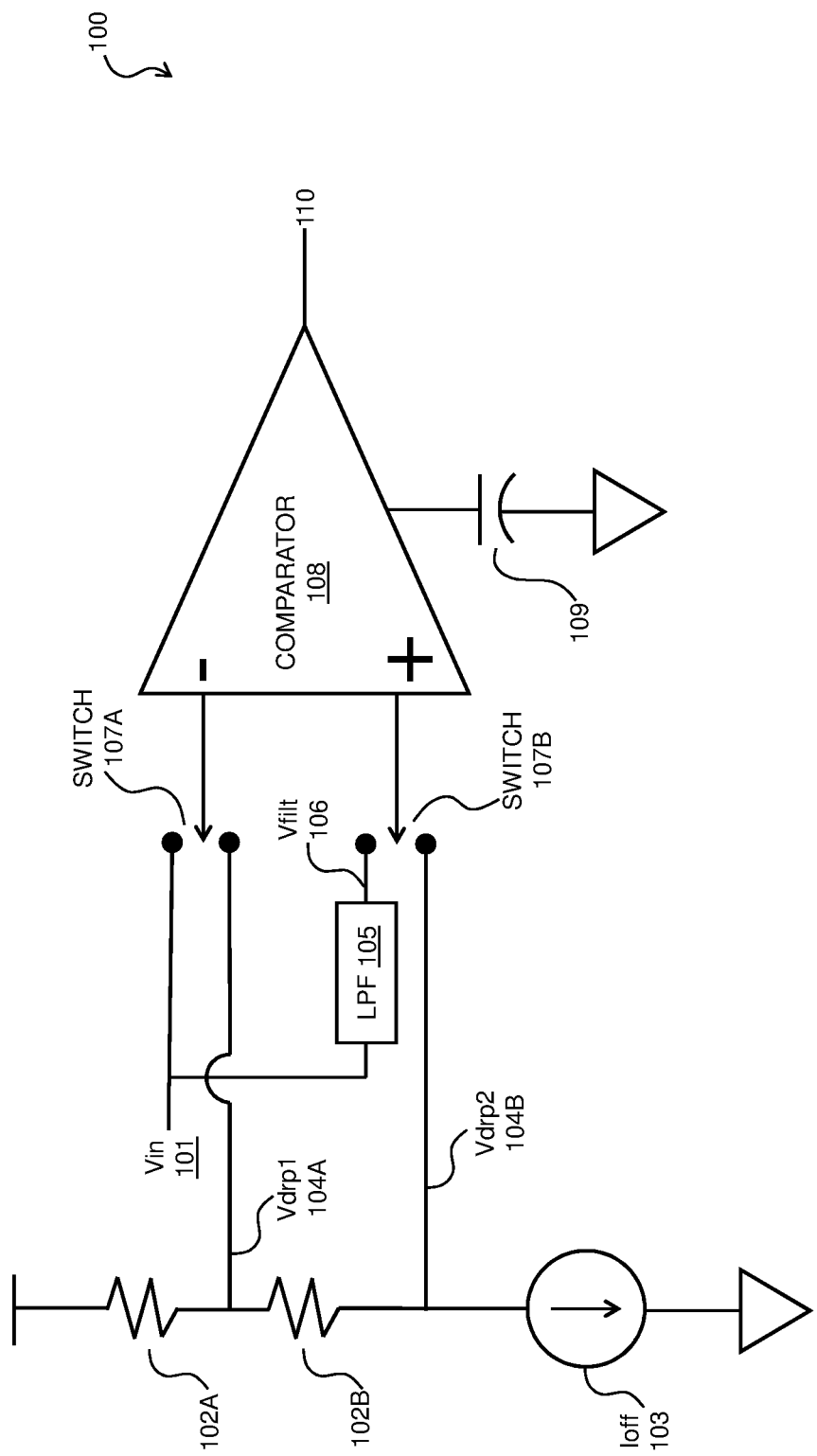
FIG. 1 is a block diagram of components of a circuit for autozero to an offset value for a slope detector for voltage droop monitoring in accordance with one or more embodiments of the present invention.

Turning now to FIG. 1, a circuit 100 that includes autozero to an offset value for a slope detector for voltage droop monitoring is generally shown in accordance with one or more embodiments of the present invention. Circuit 100 receives an input voltage $V_{in}$ 101, which is a voltage that is being monitored for voltage droop by the circuit 100 (e.g., a rail voltage in an integrated circuit). $V_{in}$ 101 is filtered by low pass filter 105 to produce $V_{filt}$ 106. Low pass filter 105 may include any appropriate circuit elements (including but not limited to a resistor and a capacitor) in various embodiments. Offset voltages $V_{drp1}$ 104A and $V_{drp2}$ 104B are generated by offset generation circuitry including a first resistor 102A, second resistor 102B, and current source $I_{off}$ 103 in circuit 100. The resistors 102A-B and the current source $I_{off}$ 103 are connected in series. Offset voltage $V_{drp1}$ 104A is located at a first node between resistor 102A and resistor 102B, and offset voltage $V_{drp2}$ 104B is located at a second node between resistor 102B and current source $I_{off}$ 103. In various embodiments, offset generation circuitry in a circuit such as circuit 100 may include any appropriate circuit elements.

Circuit 100 includes a comparator 108 having an inverting terminal and a non-inverting terminal. Each of the inverting terminal and the non-inverting terminal is connected to a respective switch, i.e., the inverting terminal is connected to switch 107A, and the non-inverting terminal is connected to switch 107B. During operation of circuit 100, switch 107A switches between two nodes based on a clock signal: $V_{in}$ 101, and $V_{drp1}$ 104A. Switch 107B also switches between two nodes based on the clock signal: $V_{filt}$ 106, and $V_{drp2}$ 104B. A trip point of the comparator 108 is stored in capacitor 109 by an autozero operation. During autozero mode of the circuit 100, switch 107A is connected to $V_{drp1}$ 104A, and switch 104B is connected to $V_{drp2}$ 104B. The comparator 107 is autozeroed to an offset value comprising a difference between $V_{drp1}$ 104A and $V_{drp2}$ 104B. This offset value is stored in capacitor 109, and determines a trip point of the comparator 108 in a compare mode. In various embodiments of circuit 100, the values of the elements of the offset generation circuitry (e.g., as shown in FIG. 1, first resistor 102A, second 102B, and $I_{off}$ 103) may each be selected to have any appropriate value, in order to generate an offset having a desired value corresponding to the difference between $V_{drp1}$ 104A and $V_{drp2}$ 104B.

In the compare mode, the switch 107A is connected to $V_{in}$ 101, and switch 107B is connected to $V_{filt}$ 106, and the comparator 108 determines a difference between $V_{filt}$ 106 and $V_{in}$ 101. If the determined difference is greater than the trip point of the comparator 108 (which was set in capacitor 109 by the autozero operation and corresponds to the difference between $V_{drp1}$ 104A and $V_{drp2}$ 104B), a droop detection signal at the comparator output 110 may toggle to indicate the presence of a voltage droop condition with respect to $V_{in}$ 101. Because $V_{filt}$ 106 is a low pass filtered version of $V_{in}$ 101 (i.e., due to low pass filter 105), if $V_{in}$ 101 decreases relatively slowly (i.e., with a relatively small slope), $V_{filt}$ 106 may track $V_{in}$ 101, and no voltage droop condition may be detected by comparator 108. If $V_{in}$ 101 decreases relatively quickly (i.e., with a relatively large slope), $V_{filt}$ 106 may change relatively slowly due to low pass filter 105, so that the difference between $V_{in}$ 101 and $V_{filt}$ 106 may be relatively high. Therefore, the output signal of the comparator 108 may toggle based on detecting a decrease in $V_{in}$ 101 that has a relatively high slope based on the comparator offset that is stored in capacitor 109, and the circuit 100 may predictively detect a voltage droop condition in $V_{in}$ 101 based on the slope just as the droop is starting.

It is to be understood that the block diagram of FIG. 1 is not intended to indicate that the circuit 100 is to include all of the components shown in FIG. 1. Rather, the circuit 100 can include any appropriate fewer or additional components not illustrated in FIG. 1 (e.g., additional connections, clock signals, switches, inputs, outputs, resistors, capacitors, current sources, comparators, etc.). Further, the various elements of circuit 100 (e.g., resistors, current sources, capacitors, etc.) may each have any appropriate value in various embodiments. Further, the embodiments described herein with respect to circuit 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
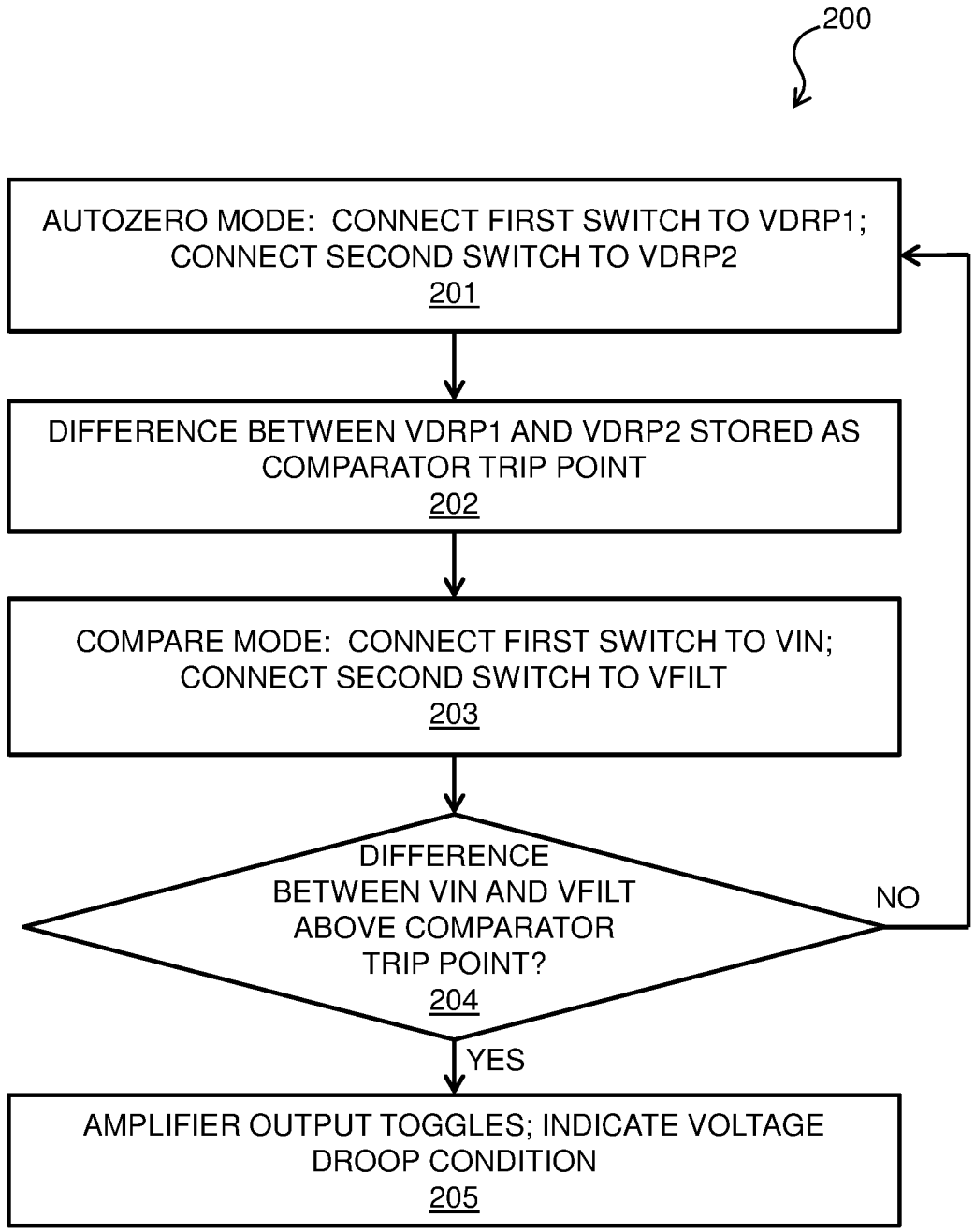
FIG. 2 is a flow diagram of a process for autozero to an offset value for a slope detector for voltage droop monitoring in accordance with one or more embodiments of the present invention.

FIG. 2 shows a process flow diagram of a method 200 for autozero to an offset value for a slope detector for voltage droop monitoring in accordance with one or more embodiments of the present invention. Embodiments of method 200 of FIG. 2 may be implemented in a circuit such as circuit 100 of FIG. 1. In block 201, the circuit is in an autozero mode. In the autozero mode, a first switch (e.g., switch 107A) connects a first terminal of a comparator (e.g., comparator 108) to a first offset voltage (e.g., $V_{drp1}$ 104A), and a second switch (e.g., switch 107B) connects a second terminal of the comparator to a second offset voltage (e.g., $V_{drp2}$ 104B). In block 202, in the autozero mode, a difference between the first offset voltage and the second offset voltage (e.g., $V_{drp1}-V_{drp2}$) is stored as a trip point of the comparator (e.g., in capacitor 109).

In block 203 of method 200, the circuit is in a compare mode. In the compare mode, the first switch (e.g., switch 107A) is connected to the input voltage of the circuit that is being monitored for voltage droop (e.g., $V_{in}$ 101), and the second switch (e.g., switch 107B) is connected to a low pass filtered version of the input voltage (e.g., $V_{filt}$ 106). In block 204, in the compare mode, the comparator determines a difference between the input voltage (e.g., $V_{in}$ 101) and the low pass filtered voltage (e.g., $V_{filt}$ 106). The determined difference is then compared to a threshold comprising the trip point of the comparator, which was set in block 202 based on the difference between the first offset voltage and the second offset voltage.

If the determined difference is determined not to be above the offset trip point of the comparator in block 204, flow returns from block 204 to block 201, and the circuit enters the autozero mode. If the determined difference is determined to be above the offset trip point in block 204, flow proceeds from block 204 to block 205. In block 205, a voltage droop detection signal at the comparator output toggles to indicate a voltage droop condition in the input voltage. The voltage droop condition may be determined based on a decrease in the input voltage that has a relatively large slope. The voltage droop condition may be detected predictively by the circuit based on the relatively large slope, allowing compensatory measures to be taken just as the voltage droop condition is starting in some embodiments. The circuit may switch between the autozero mode of blocks 201-202 of method 200 and the compare mode of blocks 203-204 of method 200 based on a clock signal that is provided to the switches (e.g., switches 107A-B) that are connected to the comparator terminals.

The process flow diagram of FIG. 2 is not intended to indicate that the operations of the method 200 are to be executed in any particular order, or that all of the operations of the method 200 are to be included in every case. Additionally, the method 200 can include any suitable number of additional operations.

Figure 3:
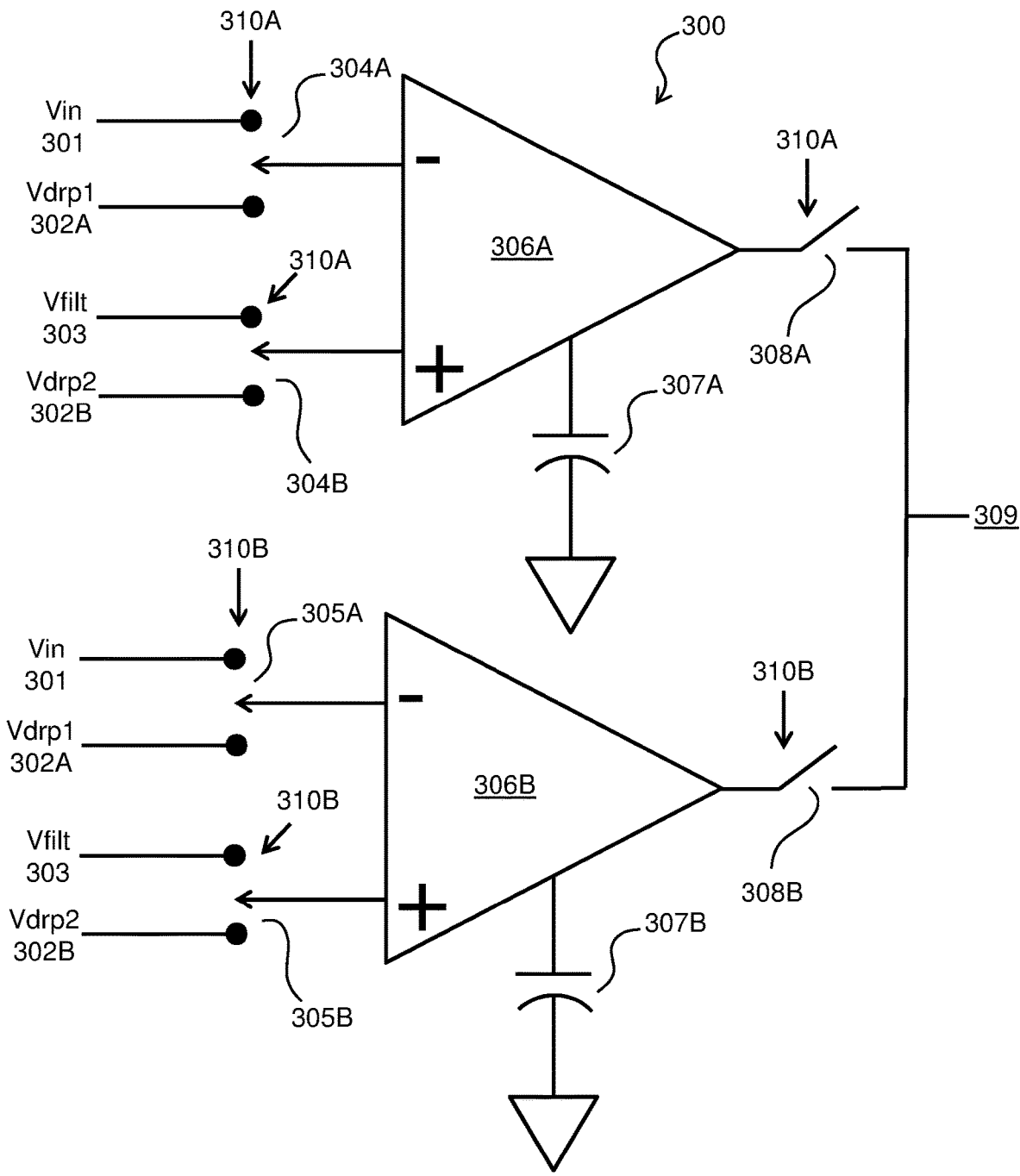
FIG. 3 is a block diagram of components of a circuit for autozero to an offset value for a slope detector for voltage droop monitoring in accordance with one or more embodiments of the present invention.

In FIG. 3, a circuit 300 that includes autozero to an offset value for a slope detector for voltage droop monitoring is generally shown in accordance with one or more embodiments of the present invention. Circuit 300 of FIG. 3 includes two comparators, comparator 306A and comparator 306B. Each of comparators 306A-B may separately implement method 200 of FIG. 2. Comparator 306A, and associated switches 304A-B and 308A, are controlled based on a first clock signal 310A, and comparator 306B, and associated switches 305A-B and 308B, are controlled based on a second clock signal 310B. The first clock signal 310A may be opposite to the second clock signal 310B. When the first comparator 306A and associated switches 304A-B are in the autozero mode based on the clock signal 310A (e.g., according to blocks 201-202 of method 200 of FIG. 2), the second comparator 306B and associated switches 305A-B are in the compare mode based on the clock signal 310B (e.g., according to blocks 203-204 of method 200 of FIG. 2). When the first comparator 306A and associated switches 304A-B are in the compare mode based on the clock signal 310A (e.g., according to blocks 203-204 of method 200 of FIG. 2), the second comparator 306B and associated switches 305A-B are in the autozero mode based on the clock signal 310B (e.g., according to blocks 201-202 of method 200 of FIG. 2).

As shown in circuit 300 of FIG. 3, the inverting terminal of comparator 306A is connected by switch 304A to either $V_{in}$ 301 (compare mode) or $V_{drp1}$ 302A (autozero mode) based on clock signal 310A. The non-inverting terminal of comparator 306A is connected by switch 304B to either $V_{filt}$ 303 (compare mode) or $V_{drp2}$ 302B (autozero mode) based on clock signal 310A. In the autozero mode, a difference between $V_{drp2}$ 302B and $V_{drp1}$ 302A is stored in capacitor 307A as the trip point of comparator 306A. In the compare mode, a difference between $V_{in}$ 301 and $V_{filt}$ 303 is compared to the trip point of comparator 306A, and a voltage droop detection signal is generated at the output of comparator 306A (as described with respect to blocks 204-205 of FIG. 2).

The inverting terminal of comparator 306B is connected by switch 305A to either $V_{in}$ 301 (compare mode) or $V_{drp1}$ 302A (autozero mode) based on clock signal 310B. The non-inverting terminal of comparator 306B is connected by switch 305B to either $V_{filt}$ 303 (compare mode) or $V_{drp2}$ 302B (autozero mode) based on clock signal 310B. In the autozero mode, a difference between $V_{drp2}$ 302B and $V_{drp1}$ 302A is stored in capacitor 307B as the trip point of comparator 306B. In the compare mode, a difference between $V_{in}$ 301 and $V_{filt}$ 303 is compared to the trip point of comparator 306B, and a voltage droop detection signal is generated at the output of comparator 306B (as described with respect to blocks 204-205 of FIG. 2).

The circuit output 309 of circuit 300 alternately outputs the voltage droop detection signal from each of comparator 306A and comparator 306B based on the opening and closing of switches 308A-B. Switch 308A is closed based on clock signal 310A when comparator 306A is in compare mode, and is opened based on clock signal 310A when comparator 306A is in autozero mode. Switch 308B is closed based on clock signal 310B when comparator 306B is in compare mode, and is opened based on clock signal 310B when comparator 306B is in autozero mode.

It is to be understood that the block diagram of FIG. 3 is not intended to indicate that the circuit 300 is to include all of the components shown in FIG. 3. Rather, the circuit 300 can include any appropriate fewer or additional components not illustrated in FIG. 3 (e.g., additional connections, clock signals, switches, inputs, outputs, resistors, capacitors, current sources, comparators, etc.). Further, the various elements of circuit 300 (e.g., resistors, current sources, capacitors, etc.) may each have any appropriate value in various embodiments. Further, the embodiments described herein with respect to circuit 300 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   generating a first offset voltage by a circuit;
   generating a second offset voltage by the circuit, the second offset voltage being distinct from the first offset voltage; and
   based on a first comparator of the circuit entering an autozero mode:
      connecting a first terminal of the first comparator to the first offset voltage;
      connecting a second terminal of the first comparator to the second offset voltage; and
      performing an autozero operation in the first comparator, wherein a trip point of the first comparator is set to a difference between the first offset voltage and the second offset voltage by the autozero operation.

2. The method of claim 1, the circuit comprising offset generation circuitry including a first resistor, a second resistor, and a current source connected in series.

3. The method of claim 2, wherein a first node comprising the first offset voltage is located between the first resistor and the second resistor, and a second node comprising the second offset voltage is located between the second resistor and the current source.

4. The method of claim 1, comprising, based on the first comparator entering a compare mode:
   connecting the first terminal of the first comparator to an input voltage;
   connecting the second terminal of the first comparator to a filtered voltage;
   determining a difference between the filtered voltage and the input voltage; and
   comparing the determined difference to the trip point of the first comparator.

5. The method of claim 4, the circuit comprising:
   a first clock signal, wherein the first comparator switches between the compare mode and the autozero mode based on the first clock signal; and
   a second comparator that is controlled by a second clock signal that is opposite the first clock signal, such that the second comparator is in the compare mode while the first comparator is in the autozero mode, and the second comparator is in the autozero mode while the first comparator is in the compare mode.

6. The method of claim 4, the circuit comprising low pass filter circuitry, wherein the low pass filter circuitry produces the filtered voltage based on the input voltage.

7. The method of claim 1, wherein the difference between the first offset voltage and the second offset voltage is stored in a capacitor associated with the first comparator.

8. A system, comprising a circuit configured to:
   generate a first offset voltage;
   generate a second offset voltage, the second offset voltage being distinct from the first offset voltage; and
   based on a first comparator entering an autozero mode:
      connect a first terminal of the first comparator to the first offset voltage;
      connect a second terminal of the first comparator to the second offset voltage; and
      perform an autozero operation in the first comparator, wherein a trip point of the first comparator is set to a difference between the first offset voltage and the second offset voltage by the autozero operation.

9. The system of claim 8, the circuit comprising offset generation circuitry including a first resistor, a second resistor, and a current source connected in series.

10. The system of claim 9, wherein a first node comprising the first offset voltage is located between the first resistor and the second resistor, and a second node comprising the second offset voltage is located between the second resistor and the current source.

11. The system of claim 8, the circuit configured to, based on the first comparator entering a compare mode:
   connect the first terminal of the first comparator to an input voltage;
   connect the second terminal of the first comparator to a filtered voltage;
   determine a difference between the filtered voltage and the input voltage; and
   compare the determined difference to the trip point of the first comparator.

12. The system of claim 11, the circuit comprising:
   a first clock signal, wherein the first comparator switches between the compare mode and the autozero mode based on the first clock signal; and
   a second comparator that is controlled by a second clock signal that is opposite the first clock signal, such that the second comparator is in the compare mode while the first comparator is in the autozero mode, and the second comparator is in the autozero mode while the first comparator is in the compare mode.

13. The system of claim 11, the circuit comprising low pass filter circuitry, wherein the low pass filter circuitry produces the filtered voltage based on the input voltage.

14. The system of claim 8, wherein the difference between the first offset voltage and the second offset voltage is stored in a capacitor associated with the first comparator.

15. An apparatus comprising a logic circuit configured to:
   generate a first offset voltage;
   generate a second offset voltage, the second offset voltage being distinct from the first offset voltage; and
   based on a first comparator entering an autozero mode:
      connect a first terminal of the first comparator to the first offset voltage;
      connect a second terminal of the first comparator to the second offset voltage; and
      perform an autozero operation in the first comparator, wherein a trip point of the first comparator is set to a difference between the first offset voltage and the second offset voltage by the autozero operation.

16. The apparatus of claim 15, the logic circuit comprising offset generation circuitry including a first resistor, a second resistor, and a current source connected in series.

17. The apparatus of claim 16, wherein a first node comprising the first offset voltage is located between the first resistor and the second resistor, and a second node comprising the second offset voltage is located between the second resistor and the current source.

18. The apparatus of claim 15, the logic circuit configured to, based on the first comparator entering a compare mode:
   connect the first terminal of the first comparator to an input voltage;
   connect the second terminal of the first comparator to a filtered voltage;
   determine a difference between the filtered voltage and the input voltage; and
   compare the determined difference to the trip point of the first comparator.

19. The apparatus of claim 18, the logic circuit comprising:
   a first clock signal, wherein the first comparator switches between the compare mode and the autozero mode based on the first clock signal; and
   a second comparator that is controlled by a second clock signal that is opposite the first clock signal, such that the second comparator is in the compare mode while the first comparator is in the autozero mode, and the second comparator is in the autozero mode while the first comparator is in the compare mode.

20. The apparatus of claim 18, the logic circuit comprising low pass filter circuitry, wherein the low pass filter circuitry produces the filtered voltage based on the input voltage.

* * * * *